United States Patent
Sakamaki

(10) Patent No.: US 7,711,973 B2
(45) Date of Patent: May 4, 2010

(54) SYNCHRONOUS DATA TRANSFER CIRCUIT, COMPUTER SYSTEM AND MEMORY SYSTEM

(75) Inventor: Hideyuki Sakamaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1091 days.

(21) Appl. No.: 11/237,716

(22) Filed: Sep. 29, 2005

(65) Prior Publication Data

US 2006/0184844 A1 Aug. 17, 2006

(30) Foreign Application Priority Data

Jan. 31, 2005 (JP) ............................. 2005-023592

(51) Int. Cl.
- G06F 1/04 (2006.01)
- G06F 1/12 (2006.01)
- G06F 13/42 (2006.01)
- H04L 7/00 (2006.01)

(52) U.S. Cl. ................. 713/400; 713/401; 713/500; 713/503; 327/261; 327/276; 327/277

(58) Field of Classification Search ................. 713/400, 713/401, 500, 503; 327/261, 276, 277
See application file for complete search history.

(56) References Cited

U.S. PATENT DOCUMENTS 4,965,814 A * 10/1990 Yoshida et al. .............. 375/362

| | | | |
|---|---|---|---|
| 5,794,020 A | 8/1998 | Tanaka et al. | |
| 6,424,198 B1 | 7/2002 | Wolford | |
| 6,453,402 B1 | 9/2002 | Jeddeloh | |
| 6,504,790 B1 | 1/2003 | Wolford | |
| 7,126,399 B1 * | 10/2006 | Lee | 327/261 |
| 7,171,321 B2 * | 1/2007 | Best | 702/106 |
| 7,227,395 B1 * | 6/2007 | Huang et al. | 327/161 |
| 2003/0086303 A1 | 5/2003 | Jeong | |

FOREIGN PATENT DOCUMENTS

| JP | 9-8796 | | 1/1997 |
|---|---|---|---|
| JP | 09270781 A | * | 10/1997 |
| JP | 11-86545 | | 3/1999 |
| JP | 2002-278825 | | 9/2002 |
| JP | 2003-44350 | | 2/2003 |

OTHER PUBLICATIONS

Japanese Office Action issued on Nov. 17, 2009 in corresponding Japanese Patent Application 2005-023592.

* cited by examiner

*Primary Examiner*—Mark Connolly
(74) *Attorney, Agent, or Firm*—Staas & Halsey LLP

(57) ABSTRACT

A circuit synchronizes parallel data of different timing for transfer. The synchronous data transfer circuit includes a plurality of first flip-flop circuits in which the parallel data are set by a data strobe signal, a plurality of delay circuits, and a plurality of second flip-flop circuits. By configuring the second flip-flop circuits to share generation of a delay amount, the second flip-flop circuits are utilized for data synchronization by the synchronous data transfer circuit. Thus, it becomes possible to configure the delay circuits with a remarkably reduced amount of delay elements.

20 Claims, 10 Drawing Sheets

SYNCHRONOUS DATA TRANSFER CIRCUIT, COMPUTER SYSTEM AND MEMORY SYSTEM

CROSS-REFERENCE TO RELATED APPLICATIONS

This application is based upon and claims the benefit of priority from the prior Japanese Patent Application No. 2005-023592, filed on Jan. 31, 2005, the entire contents of which are incorporated herein by reference.

BACKGROUND OF THE INVENTION

1. Field of the Invention

The present invention relates to a synchronous data transfer circuit, a computer system and a memory system, for reading and transferring data from a circuit chip disposed on a substrate, and more particularly a synchronous data transfer circuit, a computer system and a memory system for transferring data at the same timing even a delay amount of the data from a circuit chip differs.

2. Description of the Related Art

With the development of the semiconductor technology and a chip mounting technique, there has been provided an apparatus on which a plurality of CPUs and a large capacity main memory device are mounted on a single substrate. For example, an apparatus termed blade server is listed. In such an apparatus, as a matter of mounting, it is difficult to dispose a plurality of modules (chips) with the same distance from other modules (chips). Accordingly, the time an IC chip requesting data (or IC chip of data request source) acquires data from an IC chip of which data is requested (or IC chip of data request target) disperses. This dispersion mainly depends on the line length and the performance of the IC chip.

With the improvement of data processing speed in recent years, the range of the above dispersion becomes hard to ignore. In order to reduce the dispersion, it becomes necessary to provide a data transfer circuit. For example, in a memory device, provision of a DLL (delay locked loop) in a register has been proposed, for example, in the official gazette of the Japanese Unexamined Patent Publication No. 2003-044350, and the official gazette of the Japanese Unexamined Patent Publication No. Hei-11-086545.

The above method using such clock control only can be applied only within an IC chip. However, since fine tuning is further required in an IC chip for transfer to another IC chip being connected, the above method is not applicable without modification.

FIG. 8 shows a block diagram of the conventional synchronous data transfer circuit; FIG. 9 shows a configuration diagram of the conventional delay circuit; and FIGS. 10, 11 show explanation diagrams of the conventional transfer operation. As shown in FIG. 8, a synchronous data transfer circuit (for example, a memory controller) 100 includes a clock control circuit 110 having a frequency dividing circuit 112 for frequency dividing a clock CLK0 of data request source; a read control circuit 120 for reading data from a chip 200 (here, memory) of data request source; and a data assembly circuit 130.

The clock CLK0 is issued to provide timing at which the data request side fetches data. The frequency dividing circuit 112 in the clock control circuit 110 frequency divides the clock CLK0 synchronously with the operation speed of the chip 200 of data request target, and transmits an operation clock CLK1 to the chip 200 of data request target.

In the chip 200 of data request target, in synchronization with the clock CLK1, a data strobe signal DQS [N:0] and data DQ [0]-DQ [N] are transmitted to the read control circuit 120 in response to a read request received. These data DQ [0]-DQ [N] are serial signals.

As shown in FIG. 10, in the read control circuit 120, the data strobe signal DQS [N:0] is input into a DQS control circuit 122. The read control circuit 120 fetches the data DQ [0]-[N] into flip-flop circuits (FF00-0N) 124-0 to 124-N, using the rise up of the DQS [0]-[N] as the clocks for FFs 124-0 to 124-N.

Meanwhile, in the data assembly circuit 130, data assembly timing is specified by the clock CLK0. Therefore, conventionally, it has been configured so that the output flip-flop circuits (FF10-1N) 128-0 128-N in the read control circuit 120 fetch (synchronize) data with the clock CLK0.

As shown in FIG. 10, since the phase of the data strobe signal DQS is not consistent with that of the clock CLK0, a delay amount determined by TAP [N:0] of delay circuits (DL (b0)) 126-0 to 126-N has been added to the outputs of FFs 124-0 to 124-N, and FFs 128-0 to 128-N is applied the clock CLK0, thereby synchronizing at the fetch timing of the data assembly circuit 130.

The data assembly circuit 130 fetches the outputs of the FFs 128-0 to 128-N into flip-flop circuits (FF20-2N) 132-0 to 132-N at the timing of the clock CLK0, and performs data assembly. As such, using the delay circuits 126-0 to 126-N, the synchronization of the data DQ has been achieved.

These delay circuits 126-0 to 126-N are constituted of eight paths having delay elements 140 of 1, 2, 3, 4, 5, 6, 7 and 8 stages, respectively, and a path selector 142, as shown in FIG. 9. In this figure, reference symbols are shown only for the path of delay elements 140 depicted by the triangles, being serially connected into 8 stages. To simplify the diagram, the reference symbols are omitted for other paths of the delay elements depicted by the triangles.

Each delay element 140 is constituted of, for example, transistor having an identical delay amount. Depending on a necessary delay amount, a path is selected by tap selection TAP0 [0] of the selector 142. The outputs of FFs 124-0 to 124-N are thus delayed for the selected delay amount (DLb0 shown in FIG. 10), and then input to FFs 128-0 to 128-N.

When the data DQ [0]-[N] are, for example, 4 bits (N=4) in parallel, the necessary number of these delay circuits 126-0 to 126-N becomes 4. Meanwhile, as shown in FIG. 8, when the chip 200 of data request target outputs a 64-bit parallel signal, dispersion in each signal is substantially large, which makes it difficult to cope with the dispersion by one data strobe signal DQ [N:0].

To solve this problem, as shown in FIG. 11, data strobe signals [N:0]-[N:15] are output with different phases, for example, on a basis of 4 bits. This necessitates the provision of the read control circuits 120 in the corresponding number, namely, 16 in an exemplary case of the aforementioned 64 bits in parallel. Correspondingly, the delay amount TAP of delay circuits 126-0 to 126-N is set. The data assembly circuit 130 synchronizes these 4-bit parallel signals, assembles into a 64-bit parallel signal and transfers.

Further, when a plurality (m) of the IC chips 200 of the request target are existent on a substrate, the signal delay amount for each IC chip 200 differs depending on the line lengths and the performance of the chips 200.

For example, also as shown in FIG. 11, when the phase of the data strobe signal DQS for each IC chip 200 differs from the phase of the signal DQS shown in FIG. 10, the delay amount becomes DLbm, which is different from the delay amount of the aforementioned delay circuit shown in FIG. 9.

As a result, as shown in FIG. 8, the necessary number of the read control circuits 120 is 16×m, and further, the necessary number of the delay circuits shown in FIG. 9 is 4×16×m.

As such, in the prior art, it has been necessary to provide delay circuits of which number is determined corresponding to the number of data strobe signals and the data strobe signals corresponding to the number of parallel data. Since the delay circuits are configured so as to be adjustable to arbitrary delay amount individually, the wide range of the delay amount is required. This necessitates that a large number of delay elements have been required in each delay circuit.

For example, in the aforementioned 64-bit parallel transfer, when data strobe signals are issued for every 4 bits, 16 read control circuits and 64 delay circuits are requested. In each delay circuit, because of the wide range of the delay amount, 8 delay paths and 36 delay elements (transistors) have been required, as shown in FIG. 9.

Namely, when viewed from a single read control circuit, 144 (=4×36) delay elements are required. Further, when viewed from one channel (=64 bit parallel), 16 times thereof, i.e. 2,304 delay elements are required. This necessitates a large mounting area on the circuit (chip), which impedes miniaturization and low cost. Also since the power consumption becomes large, it has been difficult to produce the chip with low power consumption. In addition, the delay element using transistors has a large dispersion of the delay amount, producing a deduced delay accuracy, and impeding high-speed synchronous transfer.

SUMMARY OF THE INVENTION

Accordingly, it is an object of the present invention to provide a synchronous data transfer circuit, a computer system and a memory system, reducing the number of delay elements required for a plurality of read control circuit, thereby reducing the mounting area of the delay circuits in a chip.

It is also an object of the present invention to provide a synchronous data transfer circuit, a computer system and a memory system, reducing the number of delay elements required for a plurality of read control circuit, thereby realizing miniaturization and low cost of a chip.

Further, it is an object of the present invention to provide a synchronous data transfer circuit, a computer system and a memory system, reducing the number of delay elements required for a plurality of read control circuit, thereby reducing the power consumption of a chip.

Still further, it is an object of the present invention to provide a synchronous data transfer circuit, a computer system and a memory system, reducing the number of delay elements required for a plurality of read control circuit, reducing dispersion of a delay amount, and thereby realizing high-speed transfer.

In order to achieve the aforementioned objects, according to the present invention, a synchronous data transfer circuit includes: a plurality of first flip-flop circuits setting parallel data according to a data strobe signal; a plurality of delay circuits delaying the outputs of the plurality of the first flip-flop circuits by a first delay amount; a classification circuit selecting a clock for obtaining a second delay amount from a plurality of clocks of different phases; and a plurality of second flip-flop circuits setting the outputs of the plurality of the delay circuits according to the clock. Thereby, synchronous data are output from the second flip-flop circuits.

Further, a memory system in accordance with the present invention includes a plurality of synchronous data transfer circuits which synchronize parallel data being transferred with a data strobe signal from a memory, and transfer the synchronous parallel data. Each of the data transfer circuits includes: a plurality of first flip-flop circuits setting the parallel data according to the data strobe signal; a plurality of delay circuits delaying the outputs of the plurality of the first flip-flop circuits by a first delay amount; a classification circuit selecting a clock for obtaining a second delay amount from a plurality of clocks of different phases; and a plurality of second flip-flop circuits setting the outputs of the plurality of delay circuits according to the clock. Thereby, synchronous data are output from the second flip-flop circuits.

Still further, a computer system in accordance with the present invention includes a memory, a memory controller and a processor. The above memory controller includes: a plurality of first flip-flop circuits setting parallel data from the memory according to a data strobe signal from the memory; a plurality of delay circuits delaying the outputs of the plurality of first flip-flop circuits by a first delay amount; a classification circuit selecting a clock for obtaining a second delay amount from a plurality of clocks of different phases; and a plurality of second flip-flop circuits setting the outputs of the plurality of delay circuits according to the clock. Thereby, synchronous data are output from the second flip-flop circuits.

Further, according to the present invention, preferably, the classification circuit further includes a delay path which provides a selected clock with a third delay amount.

Further, according to the present invention, preferably, a DLL circuit which generates the plurality of clocks of different phases from a reference clock transmitted to a transfer source is provided.

Further, according to the present invention, preferably, a data assembly circuit having a plurality of flip-flop circuits setting the outputs of the plurality of second flip-flop circuits, using a clock of a transfer target, is provided.

Further, according to the present invention, preferably, each of the plurality of delay circuits includes a plurality of delay paths, each having different number of stages of delay elements in series connection, and a selector which tap selects either one of the plurality of delay paths.

Further, according to the present invention, preferably, the classification circuit includes a selector which tap selects one clock out of the plurality of clocks.

Further, according to the present invention, preferably, a plurality of memories is connected to the synchronous data transfer circuit.

Still further, according to the present invention, preferably, the connection distances between the synchronous data transfer circuit and the plurality of memories are different.

Further scopes and features of the present invention will become more apparent by the following description of the embodiments with the accompanied drawings.

DETAILED DESCRIPTION OF THE INVENTION

The preferred embodiment of the present invention is described herein after referring to the charts and drawings, in order of a computer system, a synchronous data transfer circuit, and other embodiments.

Computer System

Figure 1:
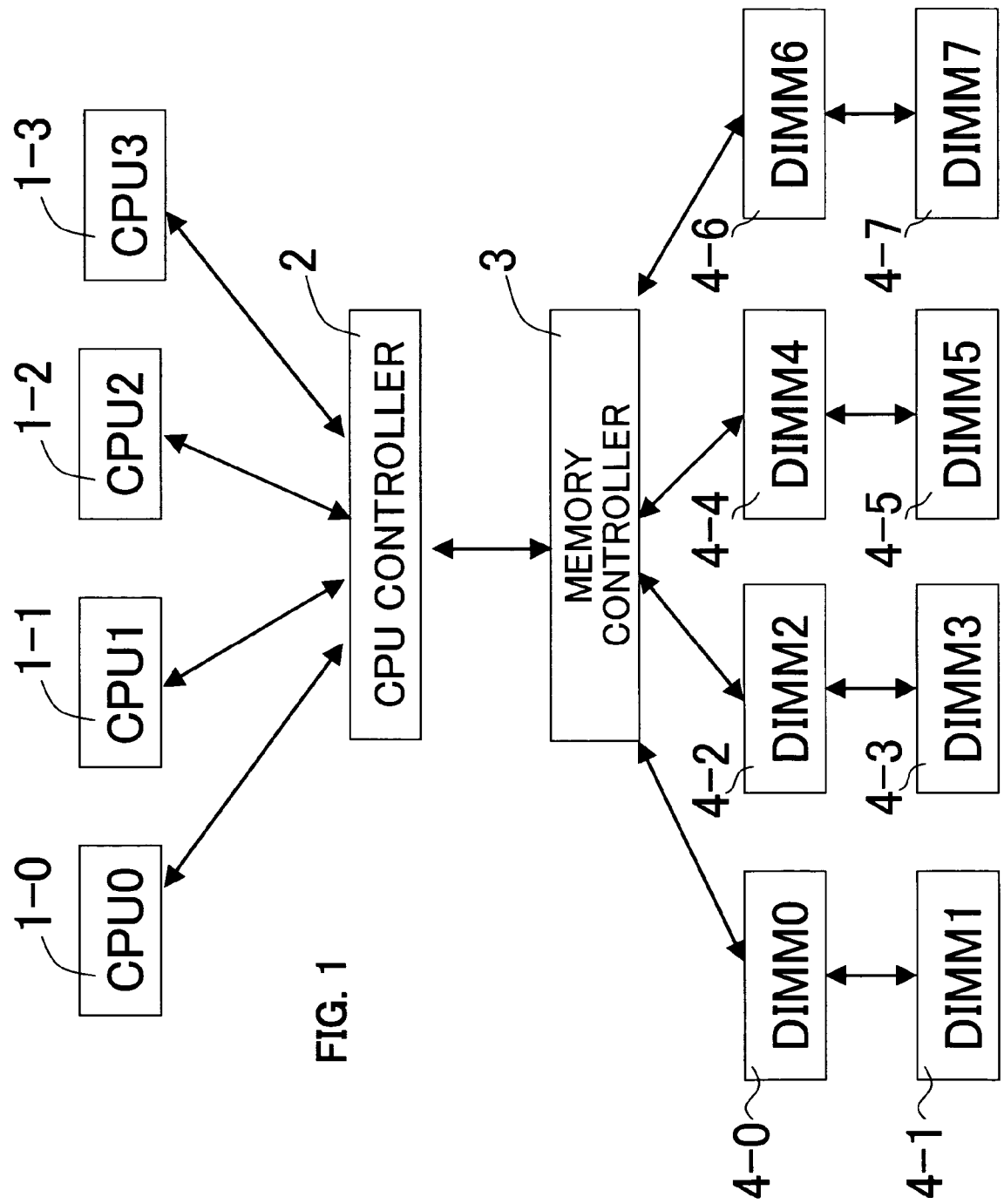
FIG. 1 shows a configuration diagram of a computer system according to one embodiment of the present invention.
Figure 2:
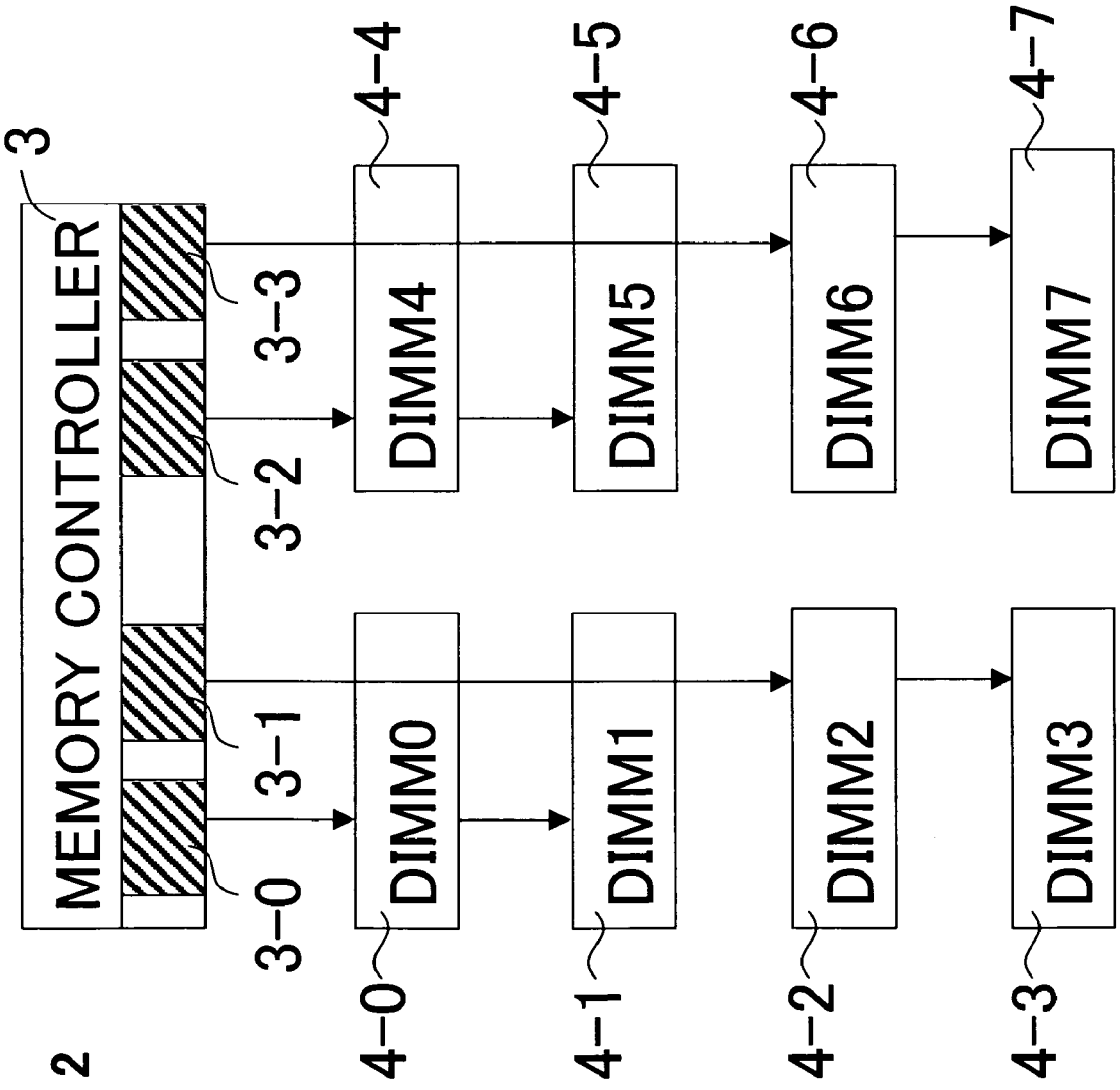
FIG. 2 shows a mounting diagram of the memory system shown in FIG. 1.

FIG. 1 shows a configuration diagram of a computer system according to one embodiment of the present invention. FIG. 2 shows a mounting diagram of the memory system shown in FIG. 1. In the above FIG. 1, a configuration of a computer board provided in a server is shown.

As shown in FIG. 1, on the computer board, four CPUs (central processor units) 1-0, 1-1, 1-2 and 1-3, a CPU control circuit 2, a memory control circuit 3, and eight DIMMs (dual in-line memory modules) 4-0 to 4-7 which constitute a main memory module are mounted. DIMMs 4-0 to 4-7 are modules having DRAM (dynamic random access memory) chips mounted thereon, having a data bus width of 64 bits.

Eight DIMMs 4-0 to 4-7 are connected to the memory control circuit 3 at the unit of two DIMMs. Accordingly, the memory control circuit 3 includes four data transfer channels. The memory control circuit 3 is connected to the CPU control circuit 2 through a 64-bit data bus, while the CPU control circuit 2 is connect to each CPU 1-0 to 1-3 (more precisely, cache memory in each CPU) through four 64-bit data buses.

As shown in FIG. 2, four data transfer channels 3-0 to 3-3 in the memory control circuit 3 are connected to DIMMs 4-0, 4-1, DIMMs 4-2, 4-3, DIMMs 4-4, 4-5 and DIMMs 4-6, 4-7, respectively. Mounting on the circuit board inevitably causes different line lengths between the memory control circuit 3 and each of DIMM 4-0, 4-1, 4-2 and 4-3. Similarly, the line lengths between the memory control circuit 3 and each of DIMM 4-4, 4-5, 4-6 and 4-7 are different.

In such a computer system, since a plurality of CPUs and a large capacity main memory module can be mounted on one circuit board, the distance between each CPU and the main memory becomes short, enabling high-speed memory read and write, and high-speed parallel processing as well.

Data Transfer Circuit

Figure 3:
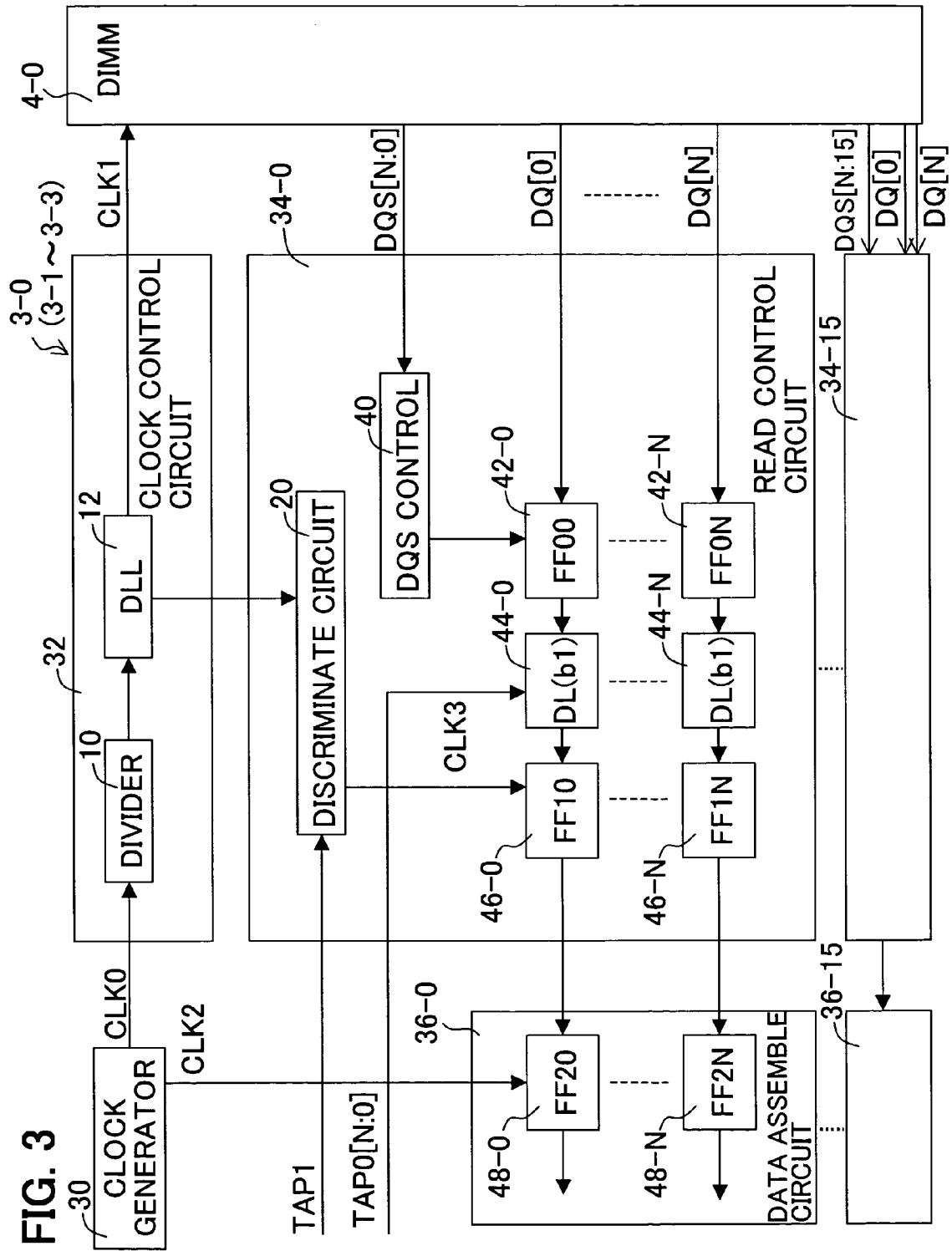
FIG. 3 shows a configuration diagram of the synchronous data transfer circuit shown in FIG. 2.
Figure 4:
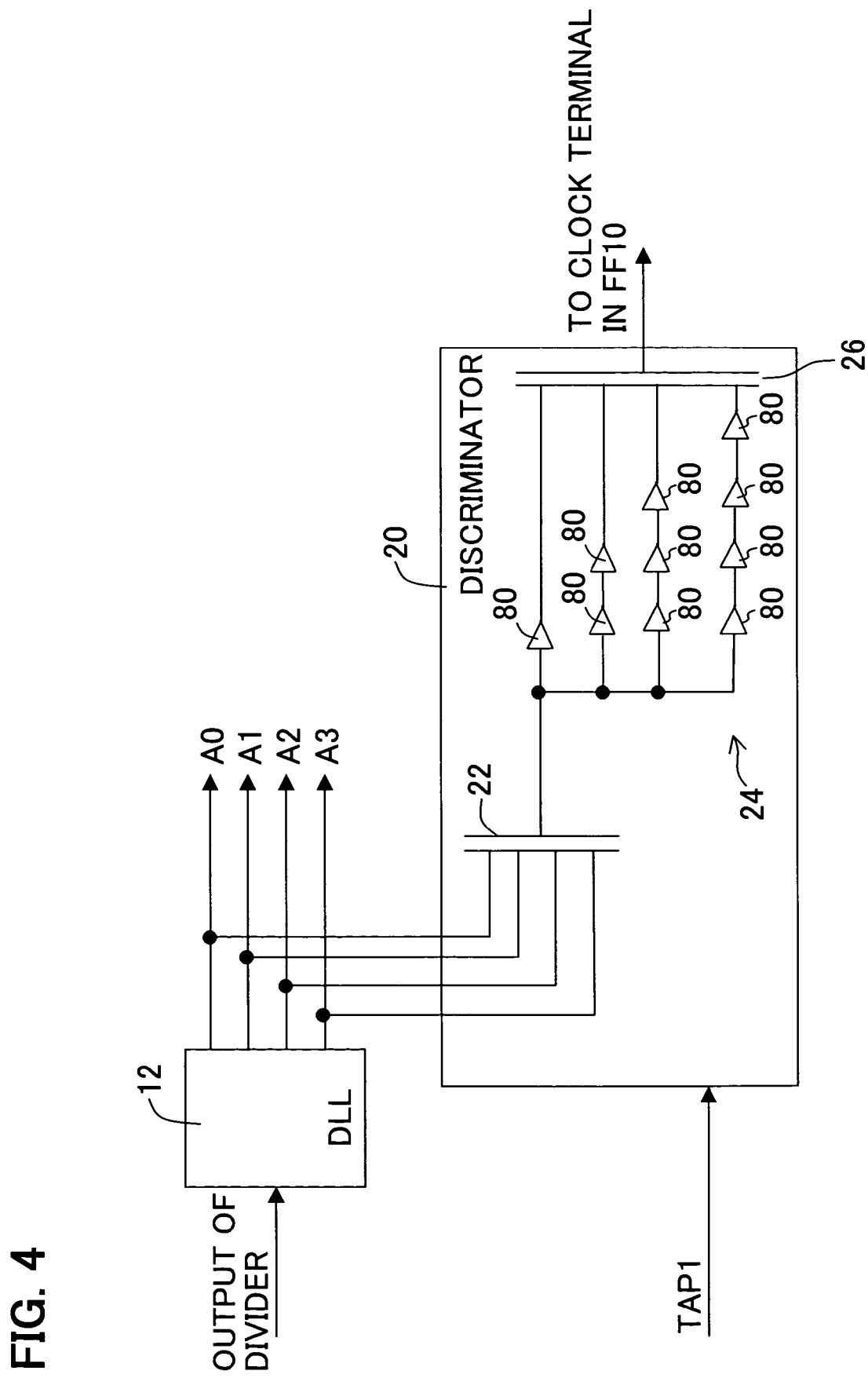
FIG. 4 shows a block diagram of the classification circuit shown in FIG. 3.
Figure 5:
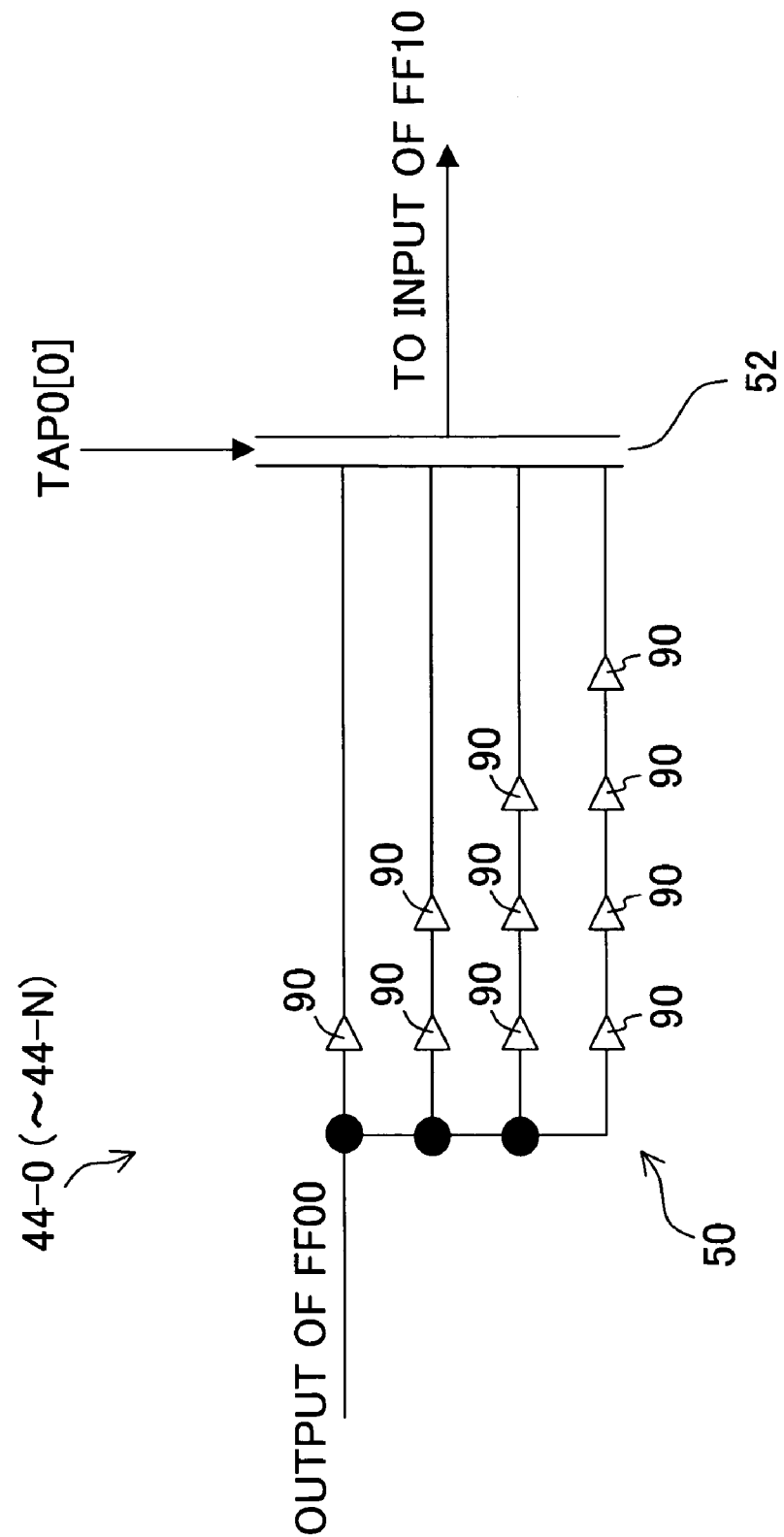
FIG. 5 shows a configuration diagram of the delay circuit shown in FIG. 3.
Figure 6:
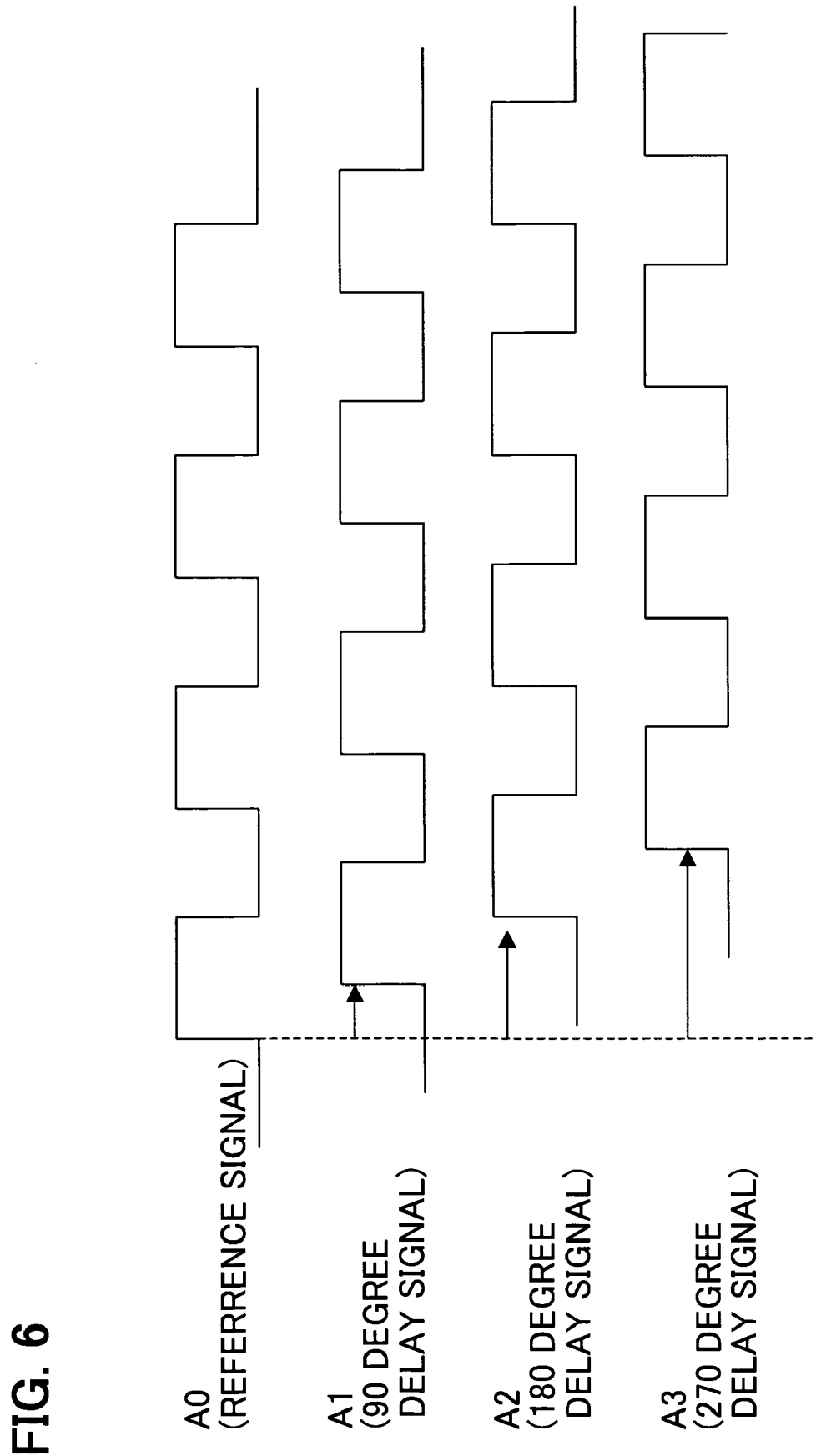
FIG. 6 shows an explanation diagram of an output clock of the DLL circuit shown in FIG. 3.
Figure 7:
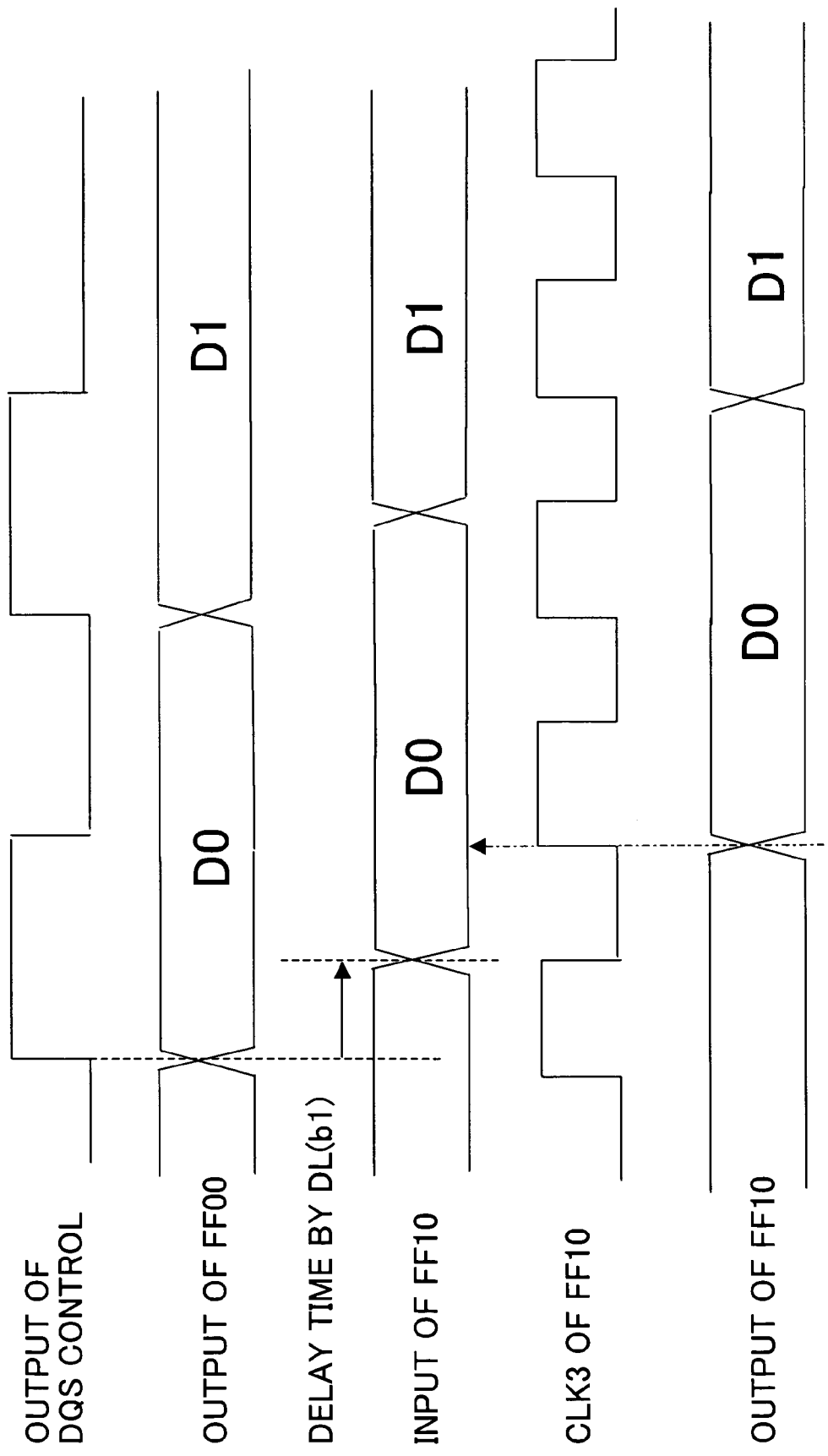
FIG. 7 shows a sequence diagram of the data transfer synchronization shown in FIG. 3.
Figure 8:
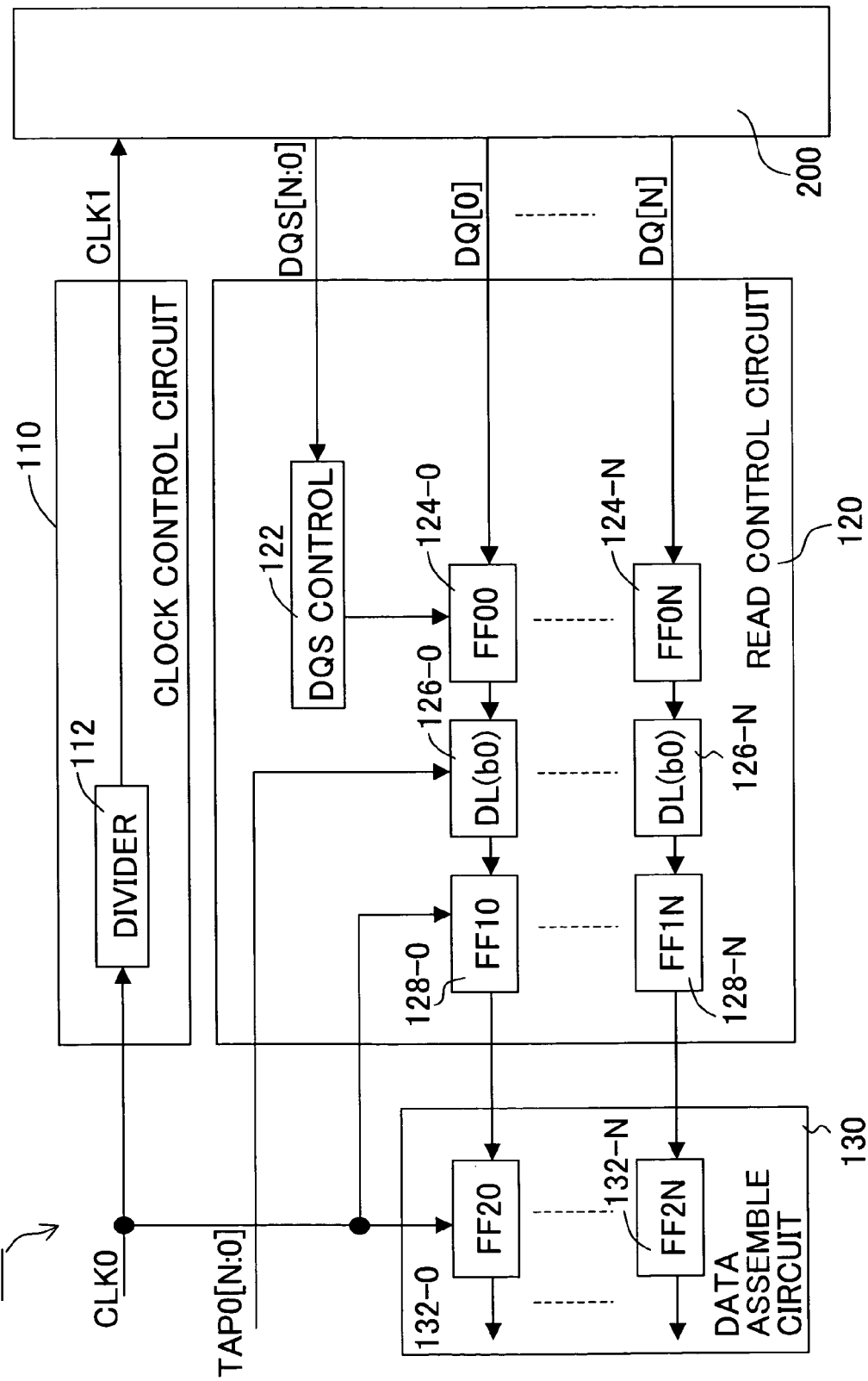
FIG. 8 shows a configuration diagram of the conventional synchronous data transfer circuit.
Figure 9:
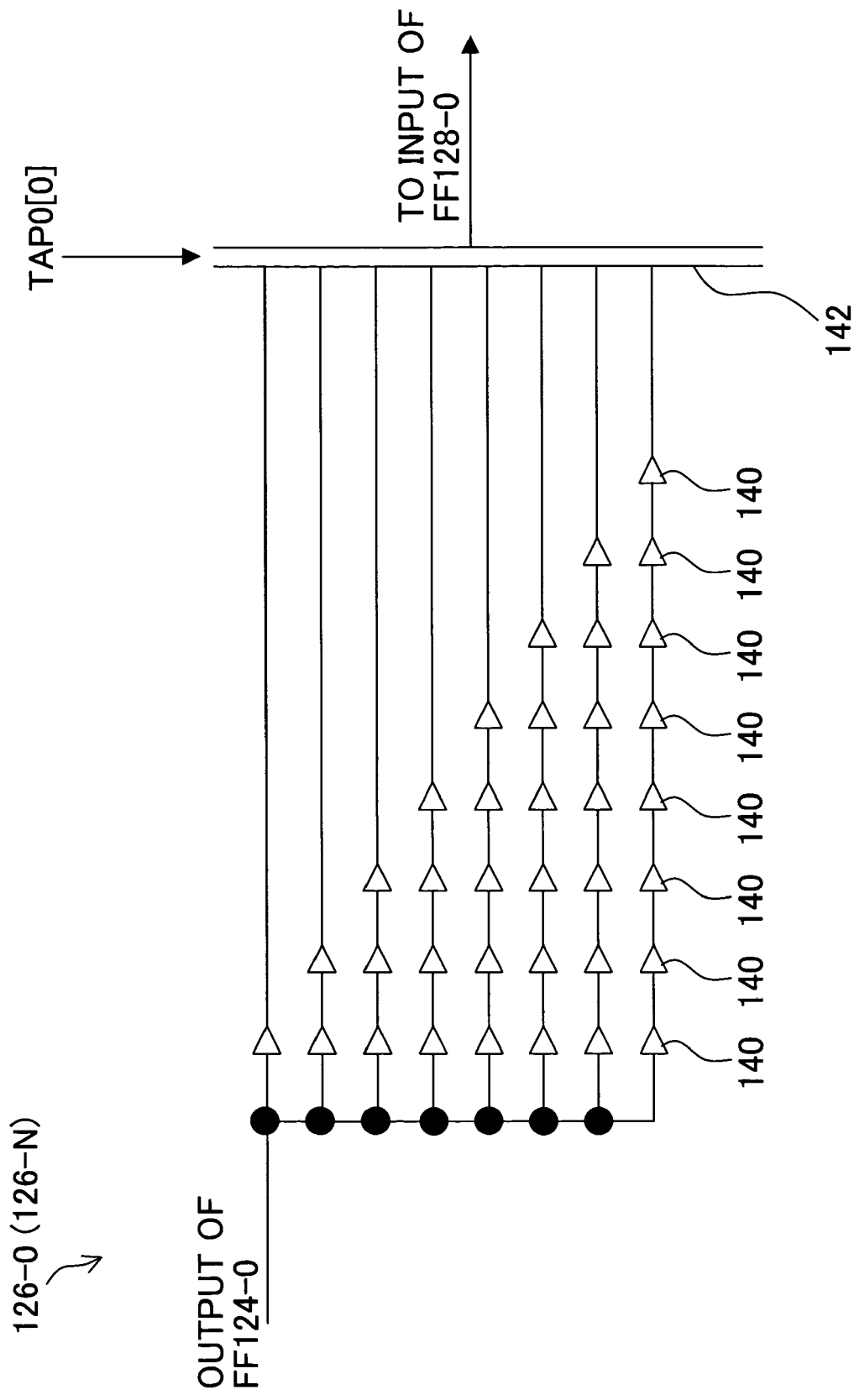
FIG. 9 shows a configuration diagram of the delay circuit shown in FIG. 8.
Figure 10:
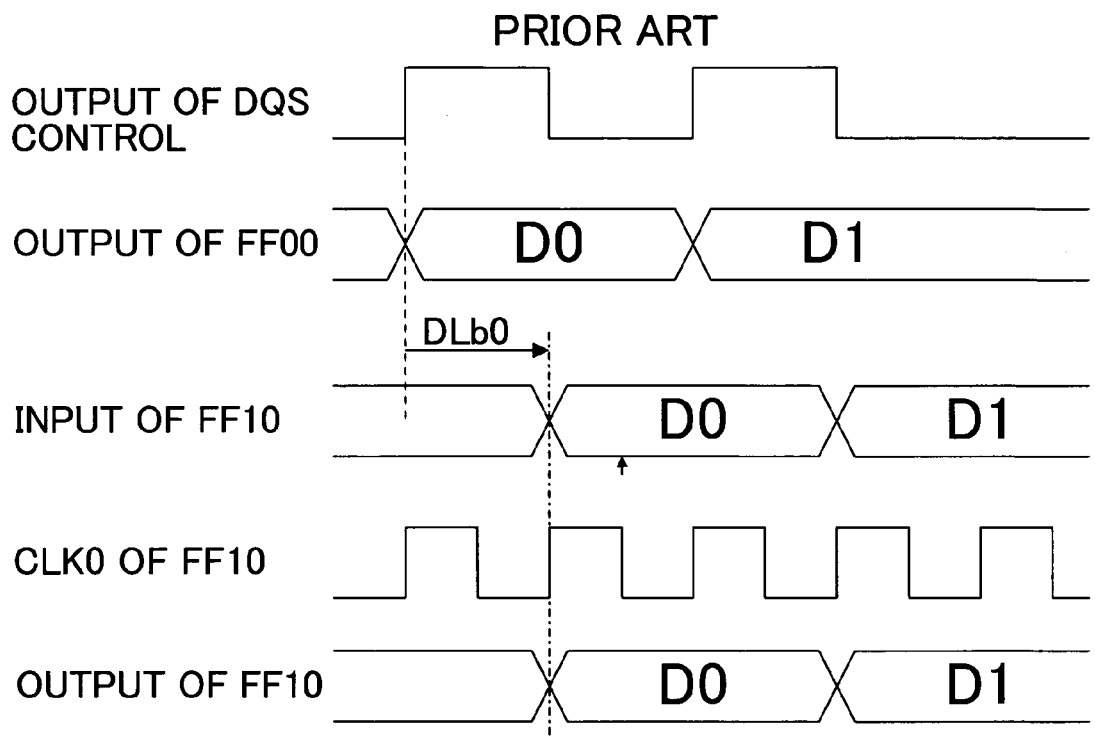
FIG. 10 shows an explanation diagram of synchronous operation of the data transfer shown in FIG. 8.
Figure 11:
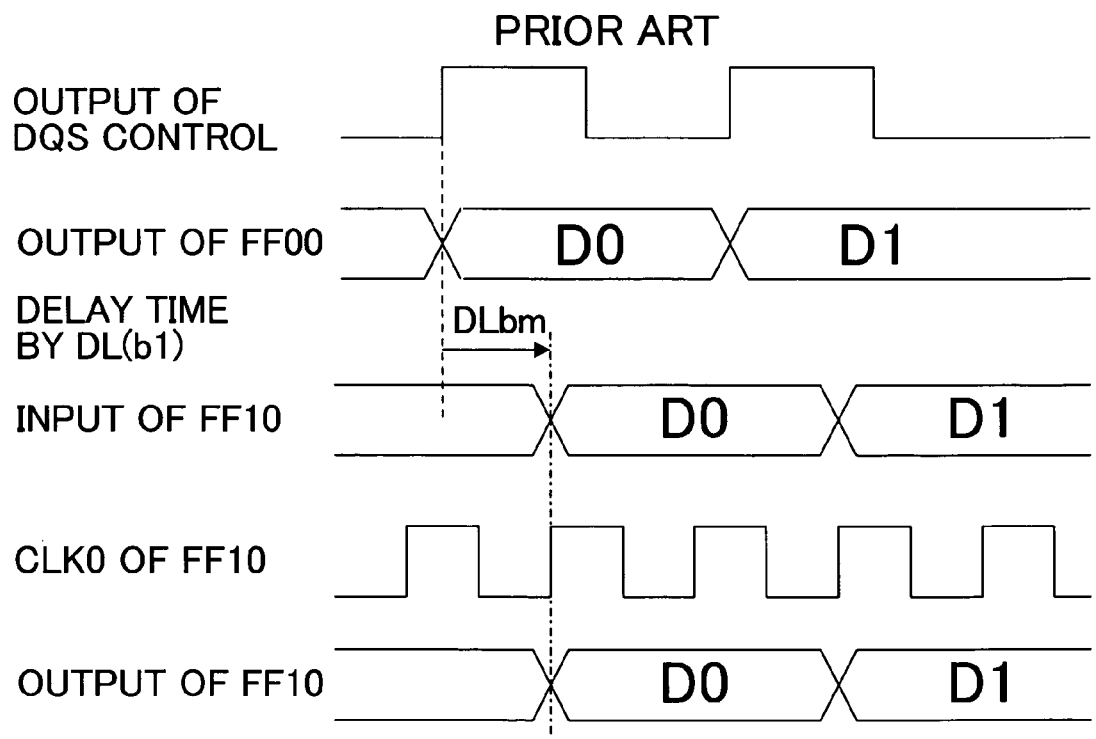
FIG. 11 shows an explanation diagram of other synchronous operation of the data transfer shown in FIG. 8.

Next, a data transfer circuit provided on each data transfer channel 3-0 to 3-3 in the memory control circuit 3 will be described. FIG. 3 shows a configuration diagram of a data transfer circuit; FIG. 4 shows configuration diagrams of the DLL and the classification circuit shown in FIG. 3; FIG. 5 shows a configuration diagram of a delay circuit, FIG. 6 shows an explanation diagram of the outputs of the DLL shown in FIG. 4; and FIG. 7 shows a time chart of the data transfer operation shown in FIG. 3.

As shown in FIG. 3, the synchronous data transfer circuit 3-0 for one channel in the memory control circuit 3 is constituted of a clock source 30, one clock control circuit 32, and sixteen 0(16) read control circuits 34-0 to 34-15, and 16 data assembly circuits 36-0 to 36-15.

The synchronous data transfer circuit 3-0 supplies a clock CLK1 to DIMM 4-0 of read request target. DIMM 4-0 transmits parallel data DQ [0]-DQ [N] of N bits (here, 4 bits) and one data strobe signal DQS [N:0] to synchronous data transfer circuit 3-0. Accordingly, when DIMM 4-0 transmits 64-bit parallel data, 16 data strobe signals and 16 four-bit parallel data are transmitted to the synchronous data transfer circuit 3-0.

Corresponding to each data strobe signal and 4-bit parallel data, read control circuits 34-0 to 34-15 and data assembly circuits 36-0 to 36-15 are provided.

As shown in FIG. 3, clock source 30 outputs a clock CLK0 and a timing clock CLK2 by which a data request side (here, the memory control circuit which is common to the system) fetches data. Clock control circuit 32 has a frequency dividing circuit 10 for frequency dividing the clock CLK0 synchronously with the operation speed of DIMM 4-0, and a DLL (delay lock loop) circuit 12. The clock control circuit 32 transmits an operation clock CLK1 to DIMM 4-0.

This DLL circuit 12 outputs a reference clock A0 for frequency dividing circuit 10, and clock signals A1, A2 and A3 having different phases from the phase of the above reference clock A0 by 90 degrees each. These four-phase clock signals A0, A1, A2 and A3 are supplied to each read control circuit 34-0 to 34-15.

Meanwhile, each read control circuit 34-0 to 34-15 includes a classification circuit 20, a DQS control circuit 40, N input flip-flop circuits (FF00-0N) 42-0 to 42-N, N delay circuits 44-0 to 44-N, and N output flip-flop circuits 46-0 to 46-N.

Further, each data assembly circuit 36-0 to 36-15 includes N flip-flop circuits 48-0 to 48-N being operated by the clock CLK2.

As shown in FIG. 4, classification circuit 20 includes a selector 22 having the four-phase clocks A0, A1, A2 and A3 being input from the DLL circuit 12, for selecting either one of the above four-phase clocks by a first delay tap TAP1. The classification circuit 20 also includes four delay paths 24, and a selector 26 for selecting either one of delay paths 24 by the first delay set value TAP1. Each delay path 24 includes delay elements 80 in series connection, each forming 1, 2, 3 or 4 stages.

The output of this classification circuit 20 becomes a fetch clock of each output flip-flop circuit 46-0 to 46-N. Also, as shown in FIG. 5, each delay circuit 44-0 to 44-N of the read control circuits 34-0 to 34-15 includes four delay paths 50, and a selector 52 for selecting either one of delay paths 50 by a second delay tap TAP0 [0]. Each delay path 50 includes delay elements 90 in series connection, each forming 1, 2, 3 or 4 stages.

Referring to FIG. 7, the operation is explained hereafter. In read control circuit 34-0, data strobe signal DQS [N:0] is input to the DQS control circuit 40. Using the rise-up of the DQS outputs as the clocks to flip-flop circuits (FF00-0N) 42-0 to 42-N, the data DQ [0]-DQ [N] are fetched by FFs 42-0 to 42-N.

Meanwhile, in the data assembly circuit 36-0, data clock timing is specified by the clock CLK2. Accordingly, each output flip-flop circuit (FF10-1N) 46-0 to 46-N in the read control circuit 34-0 produces a delay so that the data assembly circuit 36-0 can fetch data by this clock CLK2.

Namely, according to the present invention, the flip-flop circuits (FF10-1N) 46-0 to 46-N are used for synchronization of the data DQ [0]-DQ [N] in one read control circuit 34-0, while data synchronization of a plurality of the read control circuits 34-0 to 34-15 is performed in the data assembly circuits 36-0 to 36-15, using the clock CLK2.

Therefore, in one read control circuit 34-0, the flip-flop circuits (FF10-1N) 46-0 to 46-N are operated by the clock CLK3 being selected by the classification circuit 20.

In this classification circuit 20, as shown in FIG. 4, the clock CLK3 is output by obtaining a clock of an arbitrary phase out of the four-phase clock supplied by the DLL circuit 12, through the selection by the selector 22 using the first delay tap TAP1 [0], and also a fine delay amount is obtained through the selection among the delay paths 24 by the selector 26, using the first delay tap TAP1 [0].

With this clock CLK3, it becomes possible to synchronize the outputs of the flip-flop circuits 46-0 to 46-N for fetching data with the outputs of the flip-flop circuits (FF20-FF2N) 48-0 to 48-N in the data assembly circuit 36-0, with a sufficient setup margin.

Meanwhile, as shown in FIG. 5, each delay circuit (DL (b1)) 44-0 to 44-N adds a delay amount determined by a second tap value TAP0 [0] from four delay paths 50 to the output of FFs 42-0 to 42-N, and outputs to FFs 46-0 to 46-N.

As such, in the prior art, the selection is performed from among a substantially large number of delay elements to obtain a delay of an arbitrary range. In contrast, the use of the selection signal from the classification circuit 20 as the clock for the flip-flop circuits 42-0 to 42-N enables realization of the configuration with a remarkably reduced number of the delay elements 90, as compared to the prior art.

As shown in FIG. 7, as to the outputs of the input flip-flop circuits (FF00-FF0N) 42-0 to 42-N, a first delay DLb1 is applied to the data DQ [0]-DQ [N] in the delay circuits 44-0 to 44-N, and then the delayed data are input to the flip-flop circuits (FF10-FF1N) 46-0 to 46-N.

Further, the flip-flop circuits (FF10-FF1N) 46-0 to 46-N are operated by a clock signal selected by the classification circuit 20 from the output of the DLL circuit 12, and thus the data DQ are synchronized into FFs 46-0 to 46-N in the data assembly circuit 36-0.

As such, in the prior art, since the range of the delay amount in the the delay circuit DL(b0) is substantially large, a large amount of delay elements have been required. However, according to the present invention, the generation of the delay amount is also shared by the clock CLK3 of the flip-flop circuits 46-0 to 46-N. Thus, the flip-flops 46-0 to 46-N are used for data synchronization in one read control circuit 34-0. As a result, the delay circuit can be configured with a remarkably reduced number of delay elements.

Further, since only one classification circuit 20 may be added in one read control circuit 34-0 for the above purpose, the total circuit elements can be reduced also. For example, similar to those described before, in order to perform 4-bit parallel synchronization by read control circuit 34-0, in the prior art, 144 delay elements have been required in one read control circuit.

In contrast, by applying the present invention, the required number of the delay elements in the delay circuits 44-0 to 44-N of the read control circuit 34-0 is reduced to 40. Also, since the classification circuit 20 can be configured of 10 delay elements, it is possible to configure one read control circuit with merely 50 delay elements. In addition, the selectors 22, 26 in the classification circuit 20 are of simple configuration, because of simple tap selection elements. Thus, it becomes possible to reduce the number of elements to approximately one-third.

Also, in addition to the effect produced by a single read control circuit, in the case of 16 read control circuits being provided as shown in FIG. 3, it becomes possible to reduce the number of elements 16 times (i.e. 90×16=1,440), and further, for 4 channels, the reduction in the number of elements becomes 4 times additionally (i.e. 1,440×4=5,760).

As a result, the chip mounting area can be reduced, contributing to miniaturization and low cost, as well as reduced power consumption because of the reduced number of delay elements. Moreover, because of using a delay by clock together, an influence by the dispersion of the delay elements can be reduced to the minimum. For example, as accurate delay signal generation, in the prior art, when the dispersion of the delay circuit is designed as 90 ns, the actual dispersion becomes 85 to 135 ns. In contrast, when the present invention is applied, a highly accurate delay with the dispersion of 90 to 94.5 ns can be obtained, and thus, high-speed data read can be achieved.

OTHER EMBODIMENTS

According to the present invention having been described above, the read operation from DIMM (memory) is illustrated. However, it is possible to apply the present invention to the read operation from a CPU cache memory, or the synchronous transfer of transmission data between other chips. Also, although the classification circuit has been configured of clock selection and delay paths, it is possible to omit the delay paths when the DLL circuit further outputs clocks of a plurality of phases.

To summarize, according to the present invention, delay circuits can be constituted of delay elements with remarkable reduction in number, because a delay amount is also shared by a clock of second flip-flop circuits, and thus the second flip-flop circuits are used for data synchronization in a synchronous data transfer circuit. As a result, a chip mounting area can be reduced, contributing to miniaturization and low cost, and low power consumption can be attained because of the reduction of delay elements in number. Further, since a delay by clock is used together, it is possible to minimize the influence of the dispersion of the delay elements.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A synchronous data transfer circuit which synchronizes parallel data being transferred with a data strobe signal and transfers, comprising:
   a plurality of first flip-flop circuits setting the parallel data according to the data strobe signal;
   a plurality of delay circuits delaying the outputs of the plurality of first flip-flop circuits by a first delay amount;
   a classification circuit selecting a clock for obtaining a second delay amount from a plurality of clocks of different phases; and
   a plurality of second flip-flop circuits setting the outputs of the plurality of delay circuits according to the clock and outputting synchronous data.

2. The synchronous data transfer circuit according to claim 1,
   wherein the classification circuit further comprises:
   a delay path providing a selected clock with a third delay amount.

3. The synchronous data transfer circuit according to claim 1, further comprising:
   a DLL circuit generating the plurality of clocks of different phases from a reference clock transmitted to a transfer source.

4. The synchronous data transfer circuit according to claim 1, further comprising:
a data assembly circuit having a plurality of flip-flop circuits, setting the outputs of the plurality of second flip-flop circuits using a clock of a transfer target.

5. The synchronous data transfer circuit according to claim 1, wherein each of the plurality of delay circuits comprises:
a plurality of delay paths, each having different number of stages of delay elements in series connection; and
a selector which tap selects either one of the plurality of delay paths.

6. The synchronous data transfer circuit according to claim 1,
wherein the classification circuit comprises:
a selector which tap selects one clock out of the plurality of clocks.

7. A memory system comprises:
a plurality of synchronous data transfer circuits which synchronize parallel data being transferred with a data strobe signal from a memory and transfer,
wherein each of the data transfer circuits comprises:
a plurality of first flip-flop circuits setting the parallel data according to the data strobe signal from the memory;
a plurality of delay circuits delaying the outputs of the plurality of first flip-flop circuits by a first delay amount;
a classification circuit selecting a clock for obtaining a second delay amount from a plurality of clocks of different phases; and
a plurality of second flip-flop circuits setting the outputs of the plurality of delay circuits according to the clock and outputting synchronous data.

8. The memory system according to claim 7,
wherein the classification circuit further comprises:
a delay path providing a selected clock with a third delay amount.

9. The memory system according to claim 7, further comprising:
a DLL circuit generating the plurality of clocks of different phases from a reference clock transmitted to the memory, and supplying the generated clocks to each of the synchronous data transfer circuits.

10. The memory system according to claim 7,
wherein the synchronous data transfer circuit further comprises:
a data assembly circuit having a plurality of flip-flop circuits, setting the outputs of the plurality of second flip-flop circuits using a clock of a transfer target.

11. The memory system according to claim 7,
wherein each of the plurality of delay circuits comprises:
a plurality of delay paths, each having different number of stages of delay elements in series connection; and
a selector which tap selects either one of the plurality of delay paths.

12. The memory system according to claim 7,
wherein the classification circuit comprises:
a selector which tap selects one clock out of the plurality of clocks.

13. The memory system according to claim 7, further comprises a plurality of memories which are connected to the synchronous data transfer circuit.

14. The memory system according to claim 13,
wherein the connection distances between the synchronous data transfer circuit and the plurality of memories are different.

15. A computer system comprising:
a memory;
a memory controller; and
a processor,
wherein said memory controller comprising:
a plurality of first flip-flop circuits setting parallel data from the memory according to a data strobe signal from the memory;
a plurality of delay circuits delaying the outputs of the plurality of first flip-flop circuits by a first delay amount;
a classification circuit selecting a clock for obtaining a second delay amount from a plurality of clocks of different phases; and
a plurality of second flip-flop circuits setting the outputs of the plurality of delay circuits according to the clock and outputting synchronous data to the processor.

16. The computer system according to claim 15,
wherein the classification circuit further comprises:
a delay path providing a selected clock with a third delay amount.

17. The computer system according to claim 15,
wherein the memory controller further comprises:
a DLL circuit generating the plurality of clocks of different phases from a reference clock transmitted to the memory.

18. The computer system according to claim 15,
wherein the memory controller further comprises:
a data assembly circuit having a plurality of flip-flop circuits, setting the outputs of the plurality of second flip-flop circuits using a clock of a transfer target.

19. The computer system according to claim 15,
wherein each of the plurality of delay circuits comprises:
a plurality of delay paths, each having different number of stages of delay elements in series connection; and
a selector which tap selects either one of the plurality of delay paths.

20. The computer system according to claim 15,
wherein the classification circuit comprises:
a selector which tap selects one clock out of the plurality of clocks.

* * * * *